United States Patent
Lin et al.

(10) Patent No.: US 9,691,478 B1
(45) Date of Patent: Jun. 27, 2017

(54) RERAM ARRAY CONFIGURATION FOR BIPOLAR OPERATION

(71) Applicant: MACRONIX INTERNATIONAL CO., LTD., Hsinchu (TW)

(72) Inventors: Yu-Yu Lin, Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/136,360

(22) Filed: Apr. 22, 2016

(51) Int. Cl.
| | |
|---|---|
| G11C 11/00 | (2006.01) |
| G11C 13/00 | (2006.01) |
| H01L 27/24 | (2006.01) |
| H01L 45/00 | (2006.01) |

(52) U.S. Cl.
CPC ...... *G11C 13/0069* (2013.01); *G11C 13/0007* (2013.01); *G11C 13/0026* (2013.01); *G11C 13/0097* (2013.01); *H01L 27/2436* (2013.01); *H01L 45/1233* (2013.01); *H01L 45/146* (2013.01); *H01L 45/147* (2013.01); *H01L 45/16* (2013.01); *G11C 2013/0078* (2013.01); *G11C 2213/31* (2013.01); *G11C 2213/32* (2013.01); *G11C 2213/79* (2013.01)

(58) Field of Classification Search
CPC ............ G11C 13/0069; G11C 13/0097; G11C 13/0026; G11C 13/0007; H01L 27/2436; H01L 45/16; H01L 45/1233
USPC ................. 365/148, 189.03, 189.16, 189.09
See application file for complete search history.

(56) References Cited

U.S. PATENT DOCUMENTS

| | | | |
|---|---|---|---|
| 5,077,691 | A | 12/1991 | Haddad et al. |
| 5,126,973 | A | 6/1992 | Gallia et al. |
| 5,325,334 | A | 6/1994 | Roh et al. |
| 5,537,665 | A | 7/1996 | Patel et al. |
| 5,590,085 | A | 12/1996 | Yuh et al. |
| 5,621,691 | A | 4/1997 | Park |
| 5,732,030 | A | 3/1998 | Dorney |
| 5,812,466 | A | 9/1998 | Lee et al. |
| 5,953,270 | A | 9/1999 | Kim |
| 5,959,904 | A | 9/1999 | Oh |
| 5,999,463 | A | 12/1999 | Park et al. |
| 6,002,620 | A | 12/1999 | Tran et al. |

(Continued)

OTHER PUBLICATIONS

Baek, I.G., "Highly Scalable Non-volatile Resistive Memory using Simple Binary Oxide Driven by Asymmetric Unipolar Voltage Pulses," IEEE IEDM Dec. 13-15, 2004, 4 pages.

(Continued)

*Primary Examiner* — Viet Q Nguyen
(74) *Attorney, Agent, or Firm* — Haynes Beffel & Wolfeld LLP

(57) ABSTRACT

A memory architecture has improved controllability of operations for bipolar current directions used to write data in programmable resistance memory cells, including ReRAM cells based on metal oxide memory materials. Instead of a fixed gate voltage on a specific decoder transistor or cell selection device, and a control voltage set to values that cause the decoder transistor or cell selection device to operate in a fully-on mode for one current direction or in a current moderating mode with opposite current direction. Using this technology allows symmetrical or close to symmetrical operation in both current directions with little or no effect on the array complexity.

19 Claims, 13 Drawing Sheets

(56) References Cited

U.S. PATENT DOCUMENTS

| | | |
|---|---|---|
| 6,094,384 A | 7/2000 | Ka |
| 6,115,300 A | 9/2000 | Massoumi et al. |
| 6,141,268 A | 10/2000 | Chen et al. |
| 6,205,515 B1 | 3/2001 | Huang |
| 6,317,355 B1 | 11/2001 | Kang |
| 6,337,816 B1 | 1/2002 | Park et al. |
| 6,343,037 B1 | 1/2002 | Park et al. |
| 6,445,626 B1 | 9/2002 | Hsu et al. |
| 6,490,208 B2 | 12/2002 | Yoon |
| 6,496,425 B1 | 12/2002 | Abedifard et al. |
| 6,603,690 B1 | 8/2003 | Chen et al. |
| 6,665,221 B2 | 12/2003 | Abedifard et al. |
| 6,671,214 B2 | 12/2003 | Abedifard et al. |
| 6,674,676 B1 | 1/2004 | Hsu et al. |
| 6,678,191 B2 | 1/2004 | Lee et al. |
| 6,849,905 B2 | 2/2005 | Ilkbahar et al. |
| 6,915,467 B2 | 7/2005 | Pilo |
| 6,966,012 B1 | 11/2005 | Gandhi |
| 7,061,790 B2 | 6/2006 | Morimoto et al. |
| 7,064,990 B1 | 6/2006 | Dawson et al. |
| 7,134,057 B1 | 11/2006 | Kaushik et al. |
| 7,251,173 B2 | 7/2007 | Lunde et al. |
| 7,570,536 B2 | 8/2009 | Chi |
| 7,738,308 B2 | 6/2010 | Afghahi et al. |
| 7,760,553 B2 | 7/2010 | Jang |
| 7,943,920 B2 | 5/2011 | Chien et al. |
| 7,978,496 B2 | 7/2011 | Kumar et al. |
| 8,134,139 B2 | 3/2012 | Lin et al. |
| 8,279,656 B2 | 10/2012 | Chien et al. |
| 8,355,271 B2 | 1/2013 | Rabkin et al. |
| 8,962,466 B2 | 2/2015 | Lee et al. |
| 9,165,671 B2 | 10/2015 | Lee |
| 9,165,680 B2 | 10/2015 | Hung et al. |
| 9,514,815 B1 | 12/2016 | Lin et al. |
| 9,607,675 B1 * | 3/2017 | Huang ................ G11C 11/1673 |
| 2002/0142609 A1 | 10/2002 | Hart et al. |
| 2003/0031958 A1 | 2/2003 | Tohge et al. |
| 2004/0123181 A1 | 6/2004 | Moon et al. |
| 2005/0247921 A1 | 11/2005 | Lee et al. |
| 2007/0105372 A1 | 5/2007 | Geusic et al. |
| 2009/0180340 A1 | 7/2009 | Song et al. |
| 2009/0184396 A1 | 7/2009 | Kim et al. |
| 2010/0027326 A1 | 2/2010 | Kim et al. |
| 2010/0059808 A1 | 3/2010 | Zheng et al. |
| 2010/0107004 A1 | 4/2010 | Bottelli et al. |
| 2010/0308298 A1 | 12/2010 | Ninomiya et al. |
| 2010/0315870 A1 * | 12/2010 | Abedifard ............... G11C 11/16 365/171 |
| 2011/0002155 A1 | 1/2011 | Arita et al. |
| 2011/0140069 A1 | 6/2011 | Inoue |
| 2011/0180775 A1 | 7/2011 | Lin et al. |
| 2011/0249491 A1 * | 10/2011 | Abedifard ............... G11C 11/16 365/171 |
| 2012/0075909 A1 | 3/2012 | Nakura et al. |
| 2012/0075943 A1 | 3/2012 | Chen et al. |
| 2012/0097915 A1 | 4/2012 | Mikawa et al. |
| 2012/0181599 A1 | 7/2012 | Lung |
| 2012/0188813 A1 | 7/2012 | Chien et al. |
| 2012/0280199 A1 | 11/2012 | Takagi |
| 2013/0178042 A1 | 7/2013 | Ninomiya et al. |
| 2013/0182487 A1 | 7/2013 | Lee et al. |
| 2013/0308374 A1 * | 11/2013 | Gogl .................. G11C 11/1675 365/158 |
| 2014/0104933 A1 | 4/2014 | Yamahira |
| 2014/0131653 A1 | 5/2014 | Lee et al. |
| 2014/0233299 A1 | 8/2014 | Lan et al. |
| 2015/0023094 A1 | 1/2015 | Lam et al. |
| 2015/0043274 A1 | 2/2015 | Liu et al. |
| 2015/0155037 A1 | 6/2015 | Lee et al. |
| 2015/0270009 A1 | 9/2015 | Lee |
| 2016/0064059 A1 * | 3/2016 | Takahashi ........... G11C 11/1675 365/158 |

OTHER PUBLICATIONS

Chen, An, et al., "Non-Volatile Resistive Switching for Advanced Memory Applications," IEEE IEDM, Dec. 5-7, 2005, 4 pages.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

* cited by examiner

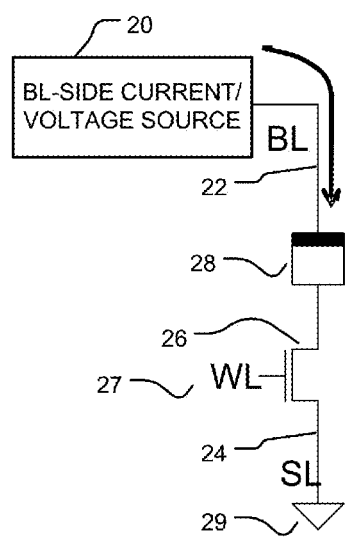 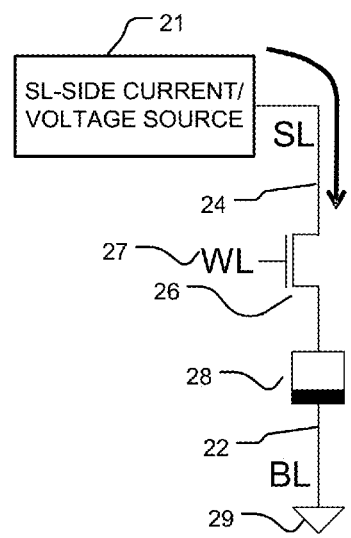
FIG. 1
prior art
FIG. 2
prior art

RERAM ARRAY CONFIGURATION FOR BIPOLAR OPERATION

BACKGROUND OF THE INVENTION

Field of the Invention

The present invention relates to high density memory arrays based on ReRAM devices, and particularly bipolar operation of ReRAM devices.

Description of Related Art

Resistive random access memory (RRAM or ReRAM) is a type of nonvolatile memory that includes a programmable resistance material, such as transition metal oxide, which can be caused to change resistance between two or more stable resistance ranges by application of electrical pulses at levels suitable for implementation in integrated circuits. The voltage and current settings applied to the ReRAM memory device determine whether the ReRAM memory device undergoes SET operations to establish a lower resistance state, or RESET operations to establish a higher resistance state.

Some ReRAM technologies are configured for "bipolar" operation, in which opposite current directions are used for reducing resistance (e.g. SET) and increasing resistance (e.g. RESET). For reliable and efficient operation of ReRAM devices, it is desirable to use well-controlled current and voltage sources for both current directions.

ReRAM cells can be configured in large arrays with bit lines, source lines and word lines. An example array can be configured so each memory cell in the array has a selection device such as a select transistor, used to connect or disconnect a current path through the memory element of the cell in response to a word line voltage. The example array can include local bit lines coupled to columns of cells, and by a local bit line decoder to global bit lines. The global bit lines can be coupled by column decoders to sense amplifiers and to controlled current/voltage circuits used to apply bias conditions to selected cells. Also, the example array can include local source lines coupled to the cells in a column of cells, and by source line decoders to global source lines or a common source line. The global source lines or common source line can be coupled to controlled current/voltage circuits used to apply bias conditions to selected cells. Select transistors in the memory cells can be connected between the memory element and the source line circuits, or alternatively, between the memory element and the bit line circuits. A large array can include several decoding stages as known in the art.

Current flow in one direction through a selected memory cell can be established using a controlled current/voltage source connected via a bit line, while the source line is set to a reference such as ground. Current flow in the opposite direction changes the roles of the bit lines and source lines so that the current flow can be established using a controlled current/voltage source connected to a source line using source side decoders, while the bit line is set to a reference such as ground.

Current though the memory cells can be controlled to some degree using the controlled current/voltage sources coupled via the decoding stages to the memory cells. However, the loading on the controlled current/voltage sources can be significantly different in the two opposite direction current paths. This makes precise control at the memory element in all the cells in the array very difficult, and particularly so when supporting bipolar operations. Variations in biasing conditions at the memory elements can increase the variation in the timing and accuracy of the programming operations in the array. Reducing these variations can lead to improvements in speed and reliability of memory using ReRAM technology.

It is desirable to provide a new bipolar programming scheme for ReRAMs to accurately control ReRAM devices.

SUMMARY

A memory including an array of programmable resistance memory cells is described which supports bipolar operations, while improving uniformity or operational ranges and reliability of the memory.

A memory architecture is described herein, which can decrease this loading effect, and improve the controllability of operations for both current directions used to write data in programmable resistance memory cells, including ReRAM cells based on metal oxide memory materials. Generally, according to the architecture described herein, one can replace a fixed gate voltage on a specific decoder transistor or cell selection device with a control voltage that can be set to values that cause the decoder transistor or cell selection device to operate in a fully on mode for one current direction or in a current moderating mode with opposite current direction. Also, this controlled voltage can be applied to the two closest transistors in the operational current path to the memory cells in the array, such as a cell selection transistor controlled by a word line voltage, and a block select transistor which connects a local bit line to a global bit line in response to a block select line. Using this technology allows symmetrical or close to symmetrical operation in both current directions with little or no effect on the array complexity.

Generally, an integrated circuit is described which includes an array of programmable memory cells and decoder circuits which selectively connect memory cells in the array to source side and bit line side voltage sources, the decoder circuits including one or more transistors on a bit line side and one or more transistors on a source line side of each programmable memory cell in the array; bit line side driver circuits which apply gate voltages to the one or more transistors on the bit line side of memory cells, and source line side driver circuits which apply gate voltages to the one or more transistors on the source line side of memory cells; and control circuitry coupled to the decoder circuits, the bit line side driver circuits and to the source line side driver circuits. The control circuitry has a first program mode in which the control circuitry causes current flow through the programmable memory cell in a first direction from the bit line side to the source line side, and causes the bit line side driver circuits to apply a non-current limiting gate voltage to a particular transistor of the one or more transistors on the bit line side, and the control circuitry applies a current limiting gate voltage to a particular transistor of the one or more transistors on the source line side; and a second program mode in which the control circuitry causes current flow through the programmable memory cell in a second direction from the source line side the bit line side, and causes the bit line side driver circuits to apply a current limiting gate voltage to the particular transistor of the one or more transistors on the bit line side, and the control circuitry applies a non-current limiting gate voltage to the particular transistor of the one or more transistors on the source line side.

A memory device described herein comprises an array including bit lines, source lines and word lines. The memory cells in the array include, respectively, memory elements in series with a bit line side switch or a source line side switch between corresponding bit lines and source lines, with corresponding word lines connected to the cell selection devices. For bipolar operation, the device includes a bit line side controlled current/voltage source and a source line side controlled current/voltage source. The device includes a bit line decoder including, generally, bit line side switches which connect the bit line side controlled current/voltage source to bit lines in the array in response to bit line transistor gate voltages. Also, for current in the opposite direction, the device includes a source line decoder including generally source line side switches which connect the source side controlled current/voltage source to source lines in the array in response to source line transistor gate voltages.

A first driver for a bit line side gate voltage has a first mode for operations including a first current direction through the memory cell, and a second mode for operations including a second current direction through the memory cell. Also, a second driver for a source line side gate voltage has a first mode for operations including said first current direction through the memory cell, and a second mode for operations including said second current direction through the memory cell.

In the first mode, a current path through a selected memory cell is between the bit line side controlled current/voltage on the bit line side of the memory cell and a reference potential on the source line side of the memory cell. The bit line side gate voltage applied by the first driver to the bit line side switches has a value setting the bit line side switches to operate in a low resistance, preferably fully-on mode, so that they behave in a non-current limiting manner, while the source line side gate voltage applied by the second driver to source line side switches has a value setting a particular source line switch of the source line side switches to behave in a current limiting manner, also called a moderated resistance mode, and other source line side switches to operate in a fully-on mode. In the second mode, a current path through a selected memory cell is between the source line side controlled current/voltage on the source line side of the memory cell and a reference potential on the bit line side of the memory cell. The source line side gate voltage applied by the second driver has a value setting the source line transistors to operate in a low resistance, preferable fully-on mode, so that they behave in a non-current limiting manner, while the bit line side gate voltage applied to the bit line side switch by the first driver has a value setting a particular bit line side to behave in a current limiting manner, also called a moderated resistance mode, and other bit line side switches to operate in a fully-on mode.

In various embodiments of the technology, in either forward or reverse directions of current flow, the amount of current through the programmable memory cell can be accurately controlled by a gate-to-source voltage of one of the bit line side and source line side switches, while reducing or eliminating variations at the programmable memory cells causes the dynamic resistance changes and a varying electrode voltages of the programmable memory cells during the writing operations.

The applied bit line side gate voltage can be switched by the first driver between a fixed (logic high voltage) to a controlled value, which results in limiting the current in the programmable memory cells. The controlled value for the bit line side can be fixed at a voltage level of different magnitude than the fixed value logic high value during a write pulse, or can vary during the write pulse.

Likewise, the applied source line side gate voltage can be switched by the second driver between a fixed (logic high voltage) to a controlled value, which results in limiting the current in the programmable memory cells. The controlled value for the source line side can be fixed at a voltage level of different magnitude than the fixed value logic high value during a write pulse, or can vary during the write pulse.

In an array implemented as described herein, the programmable memory element is electrically coupled in series between a first transistor (or switch) and a second transistor (or switch). The programmable memory element comprises a first electrode, a second electrode, and a programmable element comprising metal oxide. The programmable element electrically contacts the first electrode and the second electrode. The first transistor is electrically coupled to the first electrode of the programmable memory element. The first transistor has a first non-current limiting gate voltage and a first current limiting gate voltage. The second transistor is electrically coupled to the second electrode of the programmable memory element. The second transistor has a second non-current limiting gate voltage and a second current limiting gate voltage.

The control circuitry programs the programmable memory element in a plurality of program modes.

In a first program mode the control circuitry causes current flow through the programmable memory element in a first direction from the first electrode to the second electrode. The control circuitry applies the first non-current limiting gate voltage to the first transistor, and the control circuitry applies the second current limiting gate voltage to the second transistor.

In a second program mode the control circuitry causes current flow through the programmable memory element in a second direction from the second electrode to the first electrode. The control circuitry applies the second non-current limiting gate voltage to the second transistor. The control circuitry applies the first current limiting gate voltage to the first transistor. The second current limiting gate voltage is less than the second non-current limiting gate voltage.

Another aspect of the technology is a method of operating a programmable resistance memory device as described herein.

Another aspect of the technology is a method of manufacturing a programmable resistance memory, including control circuits and drivers as described herein.

BRIEF DESCRIPTION OF THE DRAWINGS

FIGS. 1 and 2 are schematics of bipolar biasing arrangements.

DETAILED DESCRIPTION

Figure 3:
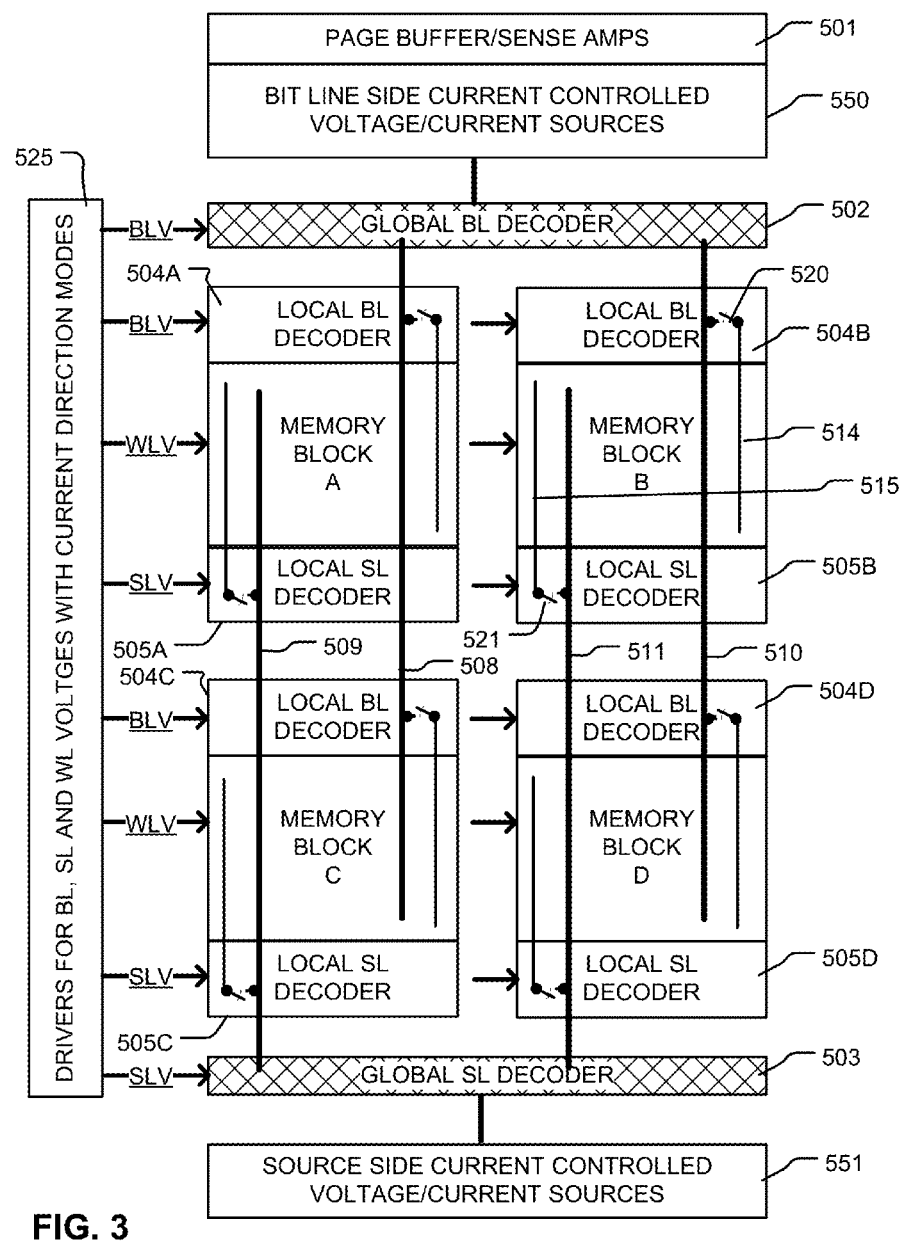
FIG. 3 is a simplified block diagram of a memory configured for bipolar operation as described herein.

FIGS. 1 and 2 schematically illustrate forward and reverse current operations for a prior art programmable resistance memory cell. A forward current direction is represented by FIG. 1, in which a bit line side current/voltage source 20 is coupled to a bit line 22 using decoding circuitry and control circuitry, not illustrated. The bit line is coupled to a memory cell that includes a memory element 28 and a cell selection device 26. The cell selection device is between the memory element 28 and a source line 24 which is connected through decoding circuitry and control circuitry, not illustrated, to ground 29 for example or another reference potential on the source line side. A cell selection device for the purposes of this description is an intra-cell switching element like a transistor paired with a programmable resistance memory element, and controlled by a voltage on a word line 27. In FIG. 2, the circuit is rotated by 180° showing a reverse current direction in which a source line side current/voltage source 21 on top is coupled to a source line 24 by decoding circuitry and control circuitry, not illustrated. The source line 24 is coupled to the memory cell that includes the cell selection device 26 and the memory element 28. The memory element 28 is between the cell selection device 26 and the bit line 22, which is connected through decoding circuitry and control circuitry, not illustrated, to ground for example or another reference potential.

In the forward direction represented by FIG. 1, cell selection device 26 is between the memory element 28 and ground. Thus, in the forward direction, the gate source voltage across the selection device can be well-controlled largely independent of the voltage drop across the memory element 28. In the reverse direction represented by FIG. 2, the positions are reversed relative to ground, so that the memory element 28 is between the cell selection device 26 and ground. In the reverse direction, the voltage drop on the memory element 28 increases the source side voltage on the cell selection device 26. The increased source side voltage can enhance the body effect in the cell selection device. Also, the voltage drop on the memory element 28 changes significantly during set and reset operations, because of the high operating current and dynamic resistance changes of the memory element.

A memory architecture is described herein which can decrease this dynamic, asymmetric loading effect, and improve the controllability of bipolar operations used to write data in programmable resistance memory cells.

FIG. 3 is a simplified diagram of an integrated circuit memory array having programmable resistance memory cells, and configured for "bipolar" operation. The array can be characterized as having a bit line side and a source line side. On the bit line side, a page buffer and sensing circuits (500) and controlled current/voltage sources (550) are connected by data lines to a global bit line decoder 502. On the source line side, complementary controlled current/voltage sources (551) are connected by source lines to a global source line decoder 503. For "bipolar" operation, controlled current/voltage sources (550, 551) are used on both ends of the array, whereas in a typical unipolar array, the source line side can be coupled only to a reference potential, such as a common ground for example. Of course there are a variety of other kinds of configurations used for programmable resistance memory cells.

The illustrated memory array includes four blocks, labeled memory block A, memory block B, memory block C, and memory block D. Global bit lines 508, 510 extend from the global bit line decoder 502 across the memory array. Likewise, global source lines 509, 511 extend from the global source line decoder 503 across the array. Each memory block has a local bit line decoder (504A, 504B, 504C, 504D). Each memory block also has a local source line decoder (505A, 505B, 505C, 505D). Each memory block includes local bit lines (e.g. 514 labeled in memory block B) and local source lines (e.g. 515 labeled in memory block B). The local bit line decoders include switches 520 which are used to connect the local bit lines to the global bit lines during operation of the memory array. Likewise, the local source line decoders include switches 521 which are used to connect a local source line to the global source lines. Memory cells in the blocks are connected between local bit lines and local source lines. Each memory cell includes a selection device in series with a memory element (not shown).

On the bit line side of the memory cells in memory block B, the current path extends from the cell, through the local bit line (514), the local bit line decoder (504B), the global bit line (510) and the global bit line decoder (502) to the controlled current/voltage sources 550. On the source line side of the memory cells in memory block B, the current path extends from the cell, through the local source line (515), the local source line decoder (505B), the global source line (511) and the global source line decoder 503 to the controlled current/voltage sources 551 on the source side. The current paths on the bit line side and source line side in each of the other memory blocks is similar.

There are a number of switches (including switches 520, 521 and the selection devices in the memory cells) in the bit line side and source line side current paths in an array configuration as represented in FIG. 1. The switches can be implemented by single transistors, or other pass gate type structures, which are configured in series to pass current between the controlled current/voltage sources (550, 551) through the memory cells. The switches are controlled by a set of drivers 525. The drivers 525 supply bit line gate voltages BLV to switches in the global bit line decoder 502 and in the local bit line decoders 504A-504D. The drivers 525 supply source line gate voltages SLV to switches in the global source line decoder 503 and in the local source line decoders 505A-505D. Also the drivers 525 supply word line voltages WLV on word lines to the selection devices in the memory cells.

In a typical configuration, the cell selection device in a memory cell is disposed on the source line side of the memory element in the memory cell, and the cell selection device is therefore a source line switch. In an alternative configuration, a cell selection device can be disposed on the bit line side of the memory element in the memory cell, in which case the cell selection device is a bit line switch.

Therefore, the word line voltage can be a source line gate voltage or a bit line gate voltage in these alternative embodiments. For the purposes of this description, the embodiment in which the cell selection device is disposed on the source line side will be adopted. It should be understood that the alternative embodiment can also be used.

The driver 525 operates according to the operation being executed in the memory array. For a write operation in a bipolar programmable resistance array, the drivers 525 supplies the drive voltages according to a first mode for operations including a first current direction through the memory cell and according to a second mode of operations including a second current direction through the memory cell.

In the first mode of operations, a current path through a selected memory cell is between the bit line side controlled current/voltage source on the bit line side of the selected memory cell and a reference potential in the source side controlled current/voltage source. For current flowing from the bit line side to the source line side, at least one of the bit line gate voltages applied by the driver 525 has a value setting a particular bit line switch to operate in a low resistance so as to behave in a non-current-limiting manner, and a particular source line switch to operate in a current limiting mode, also called a moderated resistance mode, while setting other bit line switches and the source line switches to operate in a low resistance, preferably fully-on, mode so that they behave in a non-current-limiting manner.

In the second mode of operations, for current flowing in the opposite direction, at least one of the source line gate voltages applied by the driver 525 has a value setting a particular source line switch to operate in a low resistance, preferably fully on mode so as to behave in a non-current limiting manner, and a particular bit line switch to operate in a current limiting manner, also called a moderated resistance mode, while setting other source line switches and the bit line switches to operate in a low resistance, preferably fully-on mode so that they behave in a non-current limiting manner.

In a large-scale array such as that represented by FIG. 3, the capacitive loading on the current paths is complex. Therefore it can be difficult to control the characteristics of current pulses applied for writing data through a particular memory cell using only the control current/voltage sources 550, 551 disposed in the circuits peripheral to the memory array. This problem is complicated further when well controlled current at the memory cells is needed in both directions.

The bit line switch which receives the bit line voltage set to operate the switch in a current limiting manner can be disposed anywhere along the current path on the bit line side of the memory cell. However, it is desirable in some implementations for the bit line switch used for current limiting in this manner to be located as close as practical to the memory cells. Thus, for a memory configuration in which the cell selection devices are disposed on the source line side, the bit line switch used for current limiting in this manner is one of the switches in the local bit line decoder, preferably a first transistor having one current carrying terminal on the local bit line conductor between the memory cell and the local bit line decoder circuits. The source side switch used for current limiting in the second mode is the cell selection device in the memory cell in a memory configuration in which the cell selection devices are disposed on the source line side.

The switches used for moderating or limiting current in the first and second modes can be used for both the decoding operations and current controlling operations. Switches used for both purposes receive voltages from the drivers for a fully off mode, a current limiting mode, and a fully-on mode. This enables the use of a decoder configuration without extra switches or transistors for the purposes described herein.

In alternative embodiments, extra switches can be implemented in the current paths for use in current controlling operations only, and receive voltages from the drivers for the current limiting mode and the fully-on mode only.

Figure 4:
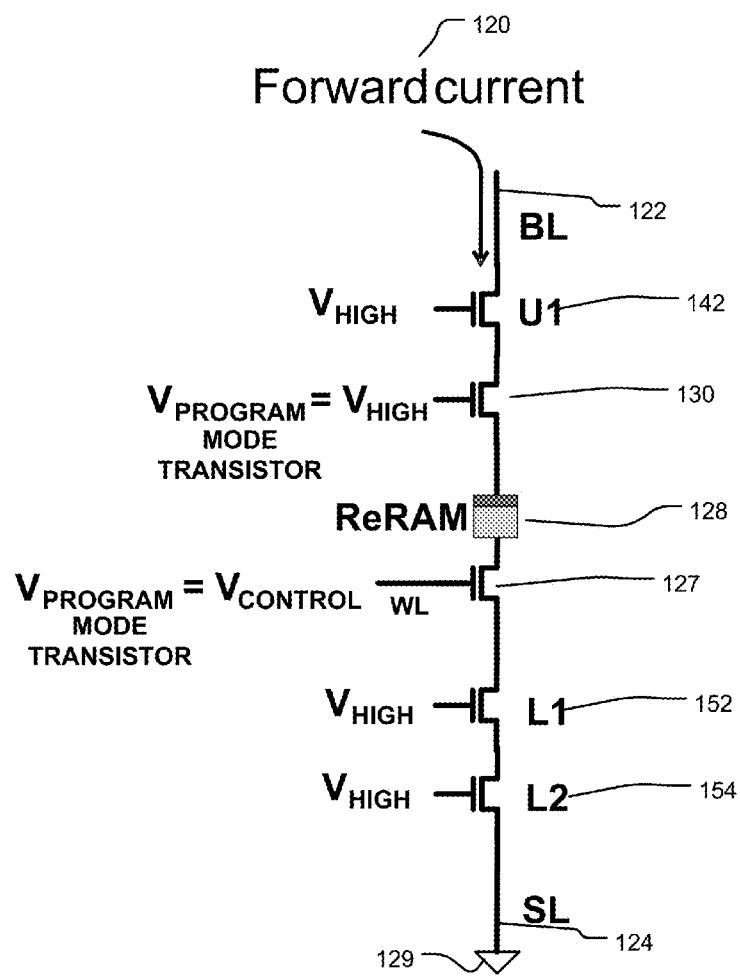
FIGS. 4 and 5 are schematics of one example in this invention, illustrating forward current and reverse current biasing arrangements of a memory element, with transistors electrically coupled to opposite sides of the memory element that respectively receive gate voltages of $V_{HIGH}$ and $V_{CONTROL}$.
Figure 5:
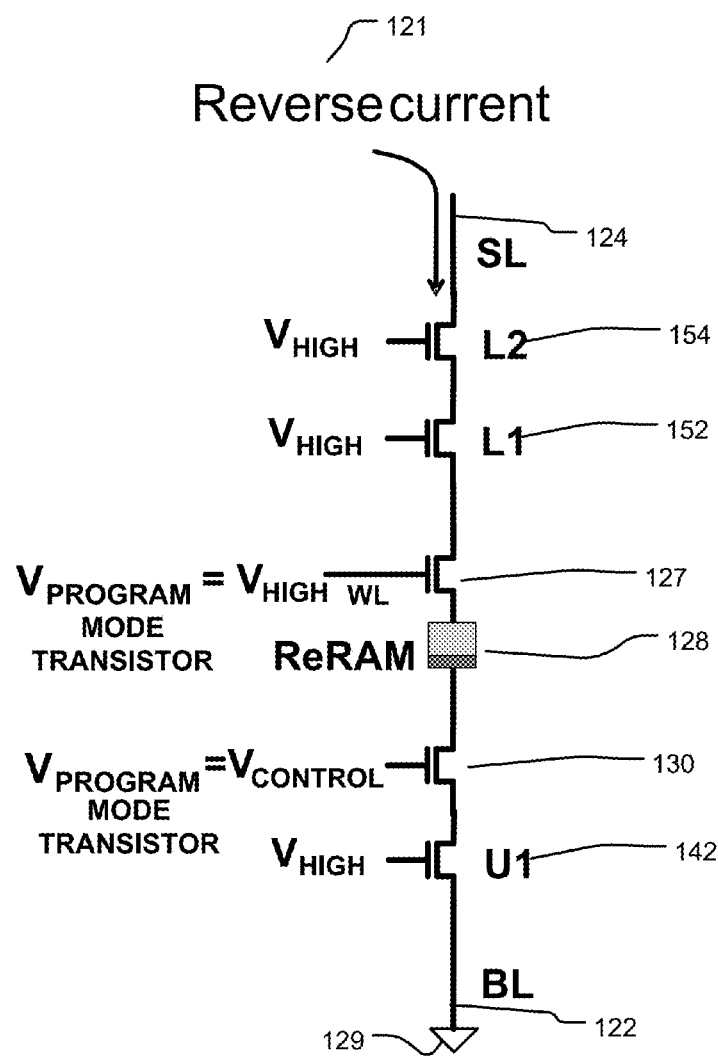

FIGS. 4 and 5 are schematics of one of the examples of controlling forward and reverse current operations described herein. The schematics illustrate forward current and reverse current biasing arrangements of a memory cell, with transistors electrically coupled to opposite sides of the memory cell that selectively receive gate voltages of $V_{HIGH}$ and $V_{CONTROL}$ (or a low voltage to turn them off when not selected). For the transistors (142, 130, 127, 152, 154), the voltage $V_{HIGH}$ is sufficient to fully turn on the transistors, such that the respective transistors are in saturation mode and can be said to be in a non-current limiting mode. The voltage $V_{CONTROL}$ has a smaller magnitude than voltage $V_{HIGH}$, when applied as a gate voltage to limit the magnitude of reverse current flow through the memory cell during a program pulse, and allow for more uniform operation across the array. A voltage $V_{LOW}$ (not shown in FIGS. 4 and 5, when applied as a gate voltage results in turning off the transistors.

FIGS. 4 and 5 illustrate examples of the bit line side switches and source line side switches described with reference to FIG. 3.

In FIG. 4, the bit line side current source/voltage bias circuit 120 provides a forward current in a current path from the bit line 122 to the source line 124. In sequential order from the bit line 122 to the source line 124, the devices include: on the bit line side upper decoder transistor U1 142 and first controlled transistor 130, and a ReRAM cell 128, and on the source line side a second controlled transistor 127, and lower decoder transistors L1 152 and L2 154. The first controlled transistor 130 can be a bit line side switch in the local bit line decoder, for example. The second controlled transistor 127 in FIG. 3 is the cell selection device coupled to the word line.

An on voltage $V_{HIGH}$ is applied to the gates of upper decoder transistor U1 142, first controlled transistor 130, and lower decoder transistors L1 152 and L2 154. The on voltage $V_{HIGH}$ is sufficient to fully turn on the respective transistors, such that the respective transistors are in saturation mode. A gate voltage of $V_{CONTROL}$ is applied to the gate of second controlled transistor 127, which results in an appropriate $V_{GS}$ of second controlled transistor 127 to limit the magnitude of forward current flow through the memory element ReRAM cell 128 during a program pulse. The source terminal of the second controlled transistor 127 in this bias arrangement is electrically coupled to reference voltage 129 through the turned-on lower decoder transistors 152, 154.

In FIG. 5, the current source/voltage bias circuit provides a reverse current 121 in a current path from the source line 124 to the bit line 122. In sequential order from the source line 124 to the bit line 122, the devices include: on the source side lower decoder transistors L2 154 and L1 152 and second controlled transistor 127, and the ReRAM cell 128, and on the bit line side the first controlled transistor 130 and upper decoder transistor U1 142. A voltage $V_{HIGH}$ is applied to the gates of upper decoder transistor U1 142, second controlled transistor 127, and lower decoder transistors L1 152 and L2 154. A gate voltage of $V_{CONTROL}$ is applied to the gate of first controlled transistor 130 on the bit line side, to limit the magnitude of reverse current flow through the memory cell during a program pulse. The source terminal of the first controlled transistor 130 in this bias arrangement is electrically coupled to reference voltage 129 through the turned-on upper decoder transistor 142.

The first controlled transistor 130 can be a local bit line select transistor used to connect a local bit line to a global bit line in a local bit line decoder. Thus, it can be located in the current path relatively close to the target memory cell so that capacitive loading between the controlled transistor and the memory cell is as small as practical.

In both the forward and reverse current directions shown in FIGS. 4 and 5, at least one of the controlled transistors receives a gate voltage of $V_{CONTROL}$. A controlled transistor receiving the voltage of $V_{CONTROL}$ is biased in linear or triode mode. The amount of current flowing through the ReRAM cell 128 is sensitive to the voltage of $V_{CONTROL}$ applied to the controlled transistor. The particular controlled transistor that is biased in linear or triode mode has a source terminal that is not coupled to the ReRAM cell 128, and can therefore have a stable or more stable voltage during the program pulse because it is separated from the dynamic resistance of the memory element. This improves control of $V_{GS}$ of the controlled transistor and the resulting current flow. Such biasing also addresses the body effect of the controlled transistor.

A RESET operation switches the memory cell 128 from a low resistance state to a high resistance state. In a RESET operation, when the memory cell 128 is biased with a voltage, the current decreases as the memory cell 128 switches from a low resistance state to a high resistance state. The RESET operation can apply a single pulse or a sequence of pulses. In one embodiment, the initial RESET pulse and subsequent RESET pulses applied to the bit line or to the source line are in a range of 1.2 V to 5 V, for example 2.3 V in a range of 10 nanoseconds to 10 microseconds, for example 800 nanoseconds. The $V_{CONTROL}$ applied as a gate voltage to cause linear mode or triode mode operation in a controlled transistor can be in a range of 1.6 V to 5V, for example 2.8 V during the RESET pulse. Before the RESET pulse, the voltage applied to the controlled transistor can be $V_{HIGH}$ to support pre-charge operations or other supporting functions to set up the RESET pulse.

A SET operation switches the memory cell 128 from a high resistance state to a low resistance state. In a SET operation, when the memory cell 128 is biased with a current, the voltage difference across the memory cell 128 decreases as the resistance of the memory cell 128 decreases from a high resistance state to a low resistance state. The SET operation can apply a single pulse or a sequence of pulses. In one embodiment, the initial SET pulse and subsequent SET pulses applied to the bit line or to the source line are in a range from 40 to 350 microamperes, such as 126 microamperes, in a range from 10 nanoseconds to 10 microseconds, for example about 800 nanoseconds. The $V_{CONTROL}$ applied as a gate voltage to cause linear mode or triode mode controlled transistor is in a range of 1.6 V to 5V, for example 2.8 V during the SET pulse. Before the SET pulse, the voltage applied to the controlled transistor can be $V_{HIGH}$ to support pre-charge operations or other supporting functions to set up the SET pulse.

In various embodiments, the pulse amplitude and width can be adjusted to optimize the resistance distribution.

In various embodiments, the number and position of decoder transistors is different and depends on the decoding requirements as determined by addressing requirements.

Figure 6:
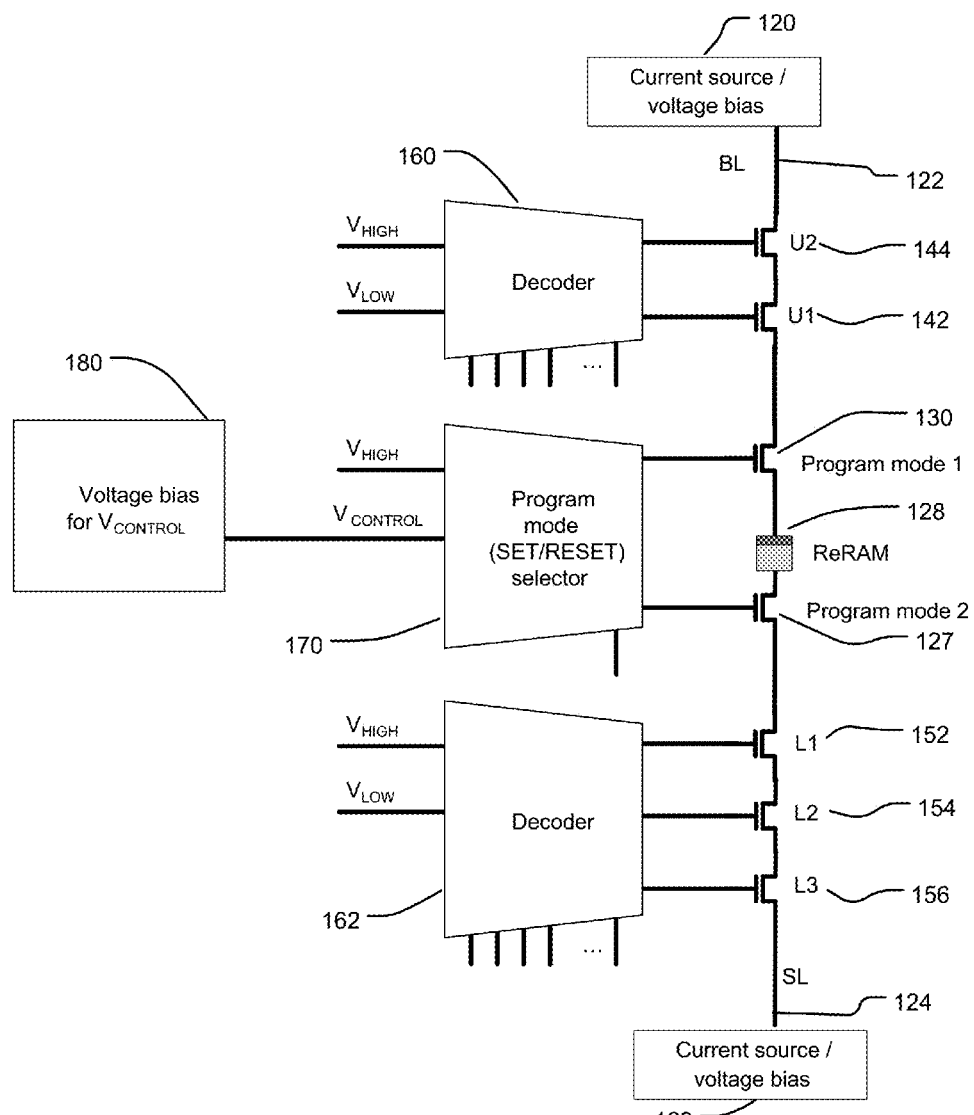
FIGS. 6-8 are schematics of forward current and reverse current biasing arrangements of a memory element. Control circuitry controls decoding with decoding transistors. Control circuitry controls the program mode with controlled transistors. The controlled transistors are electrically coupled to opposite sides of the memory element which respectively receive gate voltages of $V_{HIGH}$ and $V_{CONTROL}$.
Figure 7:
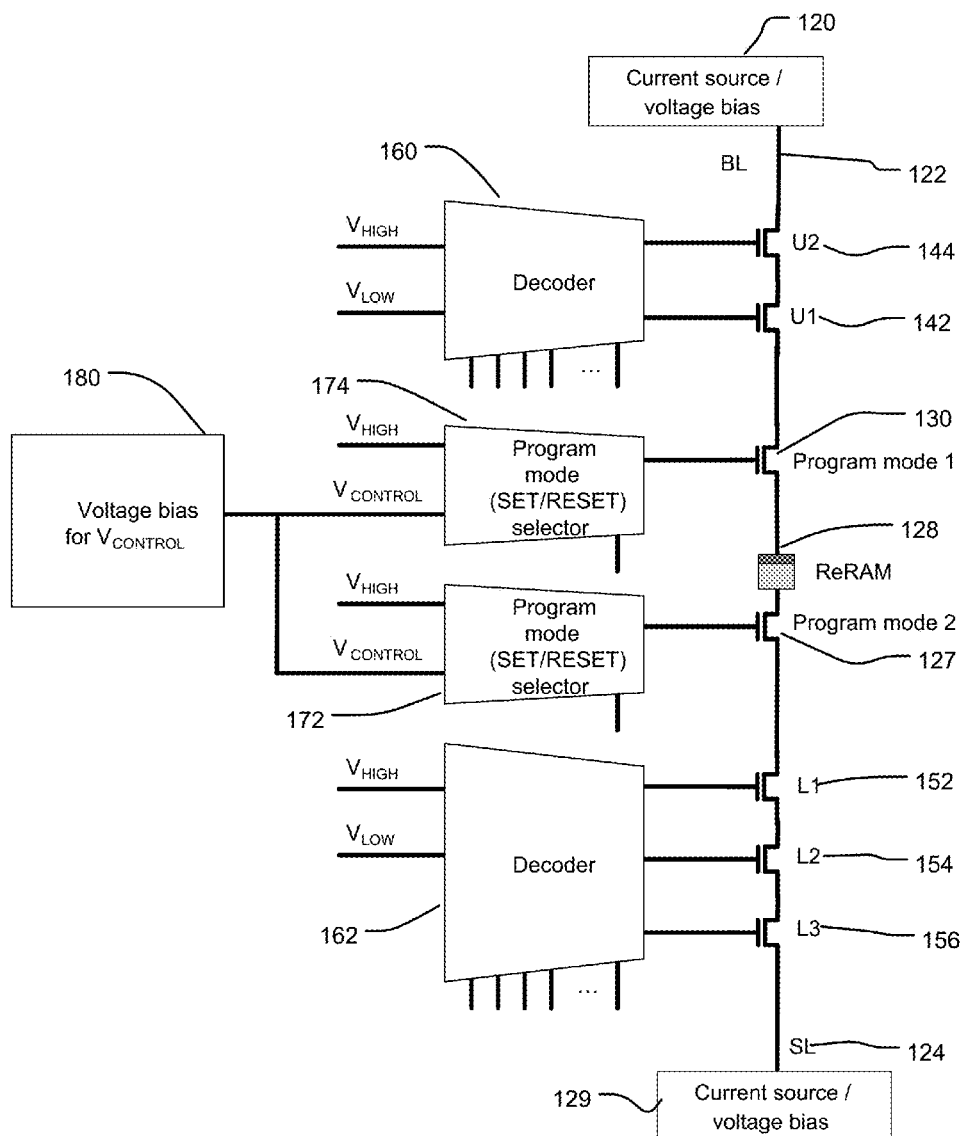
Figure 8:
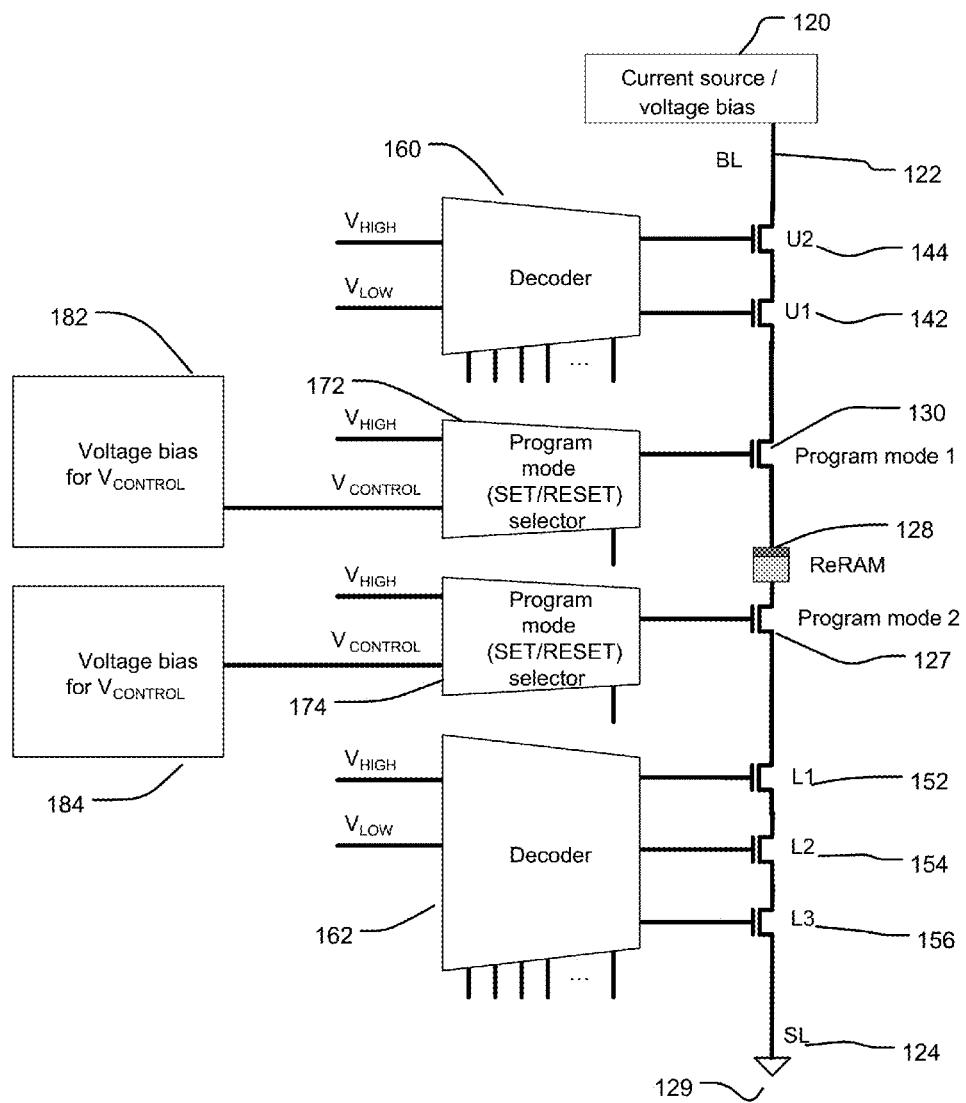

FIGS. 6-8 are schematics of forward current and reverse current biasing arrangements. In FIG. 6, the bit line side current source/voltage bias circuit 120 and the source line side current source/voltage bias circuit 129, cause current flow between bit line 122 and source line 124. The bit line side current source/voltage bias circuit 120 switches between a current source for a SET operation and a voltage bias for a RESET operation. On the other hand, the source line side current source/voltage bias circuit 129 switches between a current source for a RESET operation and a voltage bias for a SET operation.

In one embodiment, the current source/voltage bias circuits 120 and 129 are tunable or trimmable to adjust the current output of the current source and the voltage output of the voltage bias. In one embodiment, a look up table or look up tables is/are used to control the circuitry used to determine the current output of the current source and the voltage output of the voltage bias.

In sequential order from bit line 122 to source line 124, the devices include: upper decoder transistors U2 144 and U1 142; first controlled transistor 130; ReRAM cell 128; second controlled transistor 127; and lower decoder transistors L1 152, L2 154, and L3 156. The upper decoder controls transistors on the bit line side of the ReRAM cell. The lower decoder controls transistors on the source line side of the ReRAM cell. The number of upper decoder transistors versus the number of lower decoder transistors depends on a tradeoff of loading and multiplexer complexity, and on array architecture.

An upper decoder 160 receives upper decoder addressing signals, and then selectively applies $V_{HIGH}$ and $V_{LOW}$ as gate voltages to upper decoder transistors U2 144 and U1 142. A lower decoder 162 receives lower decoder addressing signals, and then selectively applies $V_{HIGH}$ and $V_{LOW}$ as gate voltages to lower decoder transistors L1 152, L2 154, and L3 156. $V_{HIGH}$ is sufficient to fully turn on the respective decoder transistors, such that the respective transistors are in saturation mode. $V_{LOW}$ turns off the respective decoder transistors, such that the respective transistors are in cut off mode. In combination, the upper decoder 160 and lower decoder 162 process address signals such that to turn on particular ones of the decoder transistors responsive to set addressing signals received by the upper decoder 160 and lower decoder 162.

Program mode (SET/RESET) selector 170 receives a program mode input signal that selects the program mode SET or RESET, and then selectively applies voltages of $V_{HIGH}$ and $V_{CONTROL}$ as gate voltages to first controlled transistor 130 and second controlled transistor 127. Depending on whether the program mode is SET or RESET according to the program mode input, program mode (SET/RESET) selector 170 couples voltages of $V_{HIGH}$ to first controlled transistor 130 and $V_{CONTROL}$ to second controlled transistor 127 as gate voltages, or couples $V_{CONTROL}$ to first controlled transistor 130 and $V_{HIGH}$ to second controlled transistor 127 as gate voltages.

The voltage of $V_{CONTROL}$ is generated by voltage bias circuit 180. For example, voltage bias circuit 180 can use parameters stored in registers or in a lookup table, determine an appropriate voltage of $V_{CONTROL}$ depending on the required current flow through ReRAM cell 128, the I-V characteristics of first controlled transistor 130 and second controlled transistor 127, the requisite $V_{GS}$ for first controlled transistor 130 and second controlled transistor 127, and the appropriate voltage of $V_{CONTROL}$ that results in the requisite $V_{GS}$. The appropriate voltage of $V_{CONTROL}$ applied to either of the controlled transistors 130 and 127 causes the controlled transistor to limit the current flow through the controlled transistor. Because the controlled transistors 130 and 127 are coupled in series with the ReRAM cell 128, the appropriate voltage magnitude of $V_{CONTROL}$ also limits current through the ReRAM cell 128. In one embodiment, a voltage bias circuit provides a series of variable voltages, such as from 0V to 4V with 128 levels, for example by dividing voltage with resistors. Other embodiments use other voltage ranges and/or other numbers of levels. Also, the voltage $V_{CONTROL}$ can be applied in a pulse which has a varying pulse magnitude during a program pulse.

FIG. 7 is a schematic of forward current and reverse current biasing arrangements of a memory cell similar to FIG. 6. However, the program mode (SET/RESET) selector 170 in FIG. 6, is split or distributed into multiple program mode (SET/RESET) selectors 172 and 174 in FIG. 7. This distributed circuit can be used in memory array architectures in which the first and second controlled transistors 130 and 127 are located such than a common driver is not practical or optimal, or when the voltage magnitude of $V_{CONTROL}$ or the pulse shape for $V_{CONTROL}$ is different for the forward and reverse modes.

Program mode (SET/RESET) selector 174 receives a program mode input signal that selects the program mode SET or RESET, and then selectively applies voltages of $V_{HIGH}$ and $V_{CONTROL}$ as gate voltage to first controlled transistor 130. Program mode (SET/RESET) selector 172 receives a program mode input signal that selects the program mode SET or RESET, and then selectively applies voltages of $V_{HIGH}$ and $V_{CONTROL}$ as gate voltage to second controlled transistor 127. In conjunction program mode (SET/RESET) selectors 172 and 174 couple the voltages of $V_{HIGH}$ to first controlled transistor 130 and $V_{CONTROL}$ to second controlled transistor 127 as gate voltages, or couples the voltages of $V_{CONTROL}$ to first controlled transistor 130 and $V_{HIGH}$ to second controlled transistor 127 as gate voltages.

FIG. 8 is a schematic of forward current and reverse current biasing arrangements of a memory cell similar to FIG. 7. However, voltage bias circuit 180 in FIG. 7, is split or distributed into voltage bias circuit 182 and voltage bias circuit 184 in FIG. 8. In one embodiment, multiple voltage bias circuits provide different working voltages for controlled transistors and save time during switch modes.

Program mode (SET/RESET) selector 174 receives a program mode input signal that selects the program mode SET or RESET, and then electrically selectively couples voltages of $V_{HIGH}$ and $V_{CONTROL}$ as gate voltage to second controlled transistor 127. Program mode (SET/RESET) selector 172 receives a program mode input signal that selects the program mode SET or RESET, and then electrically selectively couples voltages of $V_{HIGH}$ and $V_{CONTROL}$ as gate voltage to first controlled transistor 130.

Figure 9:
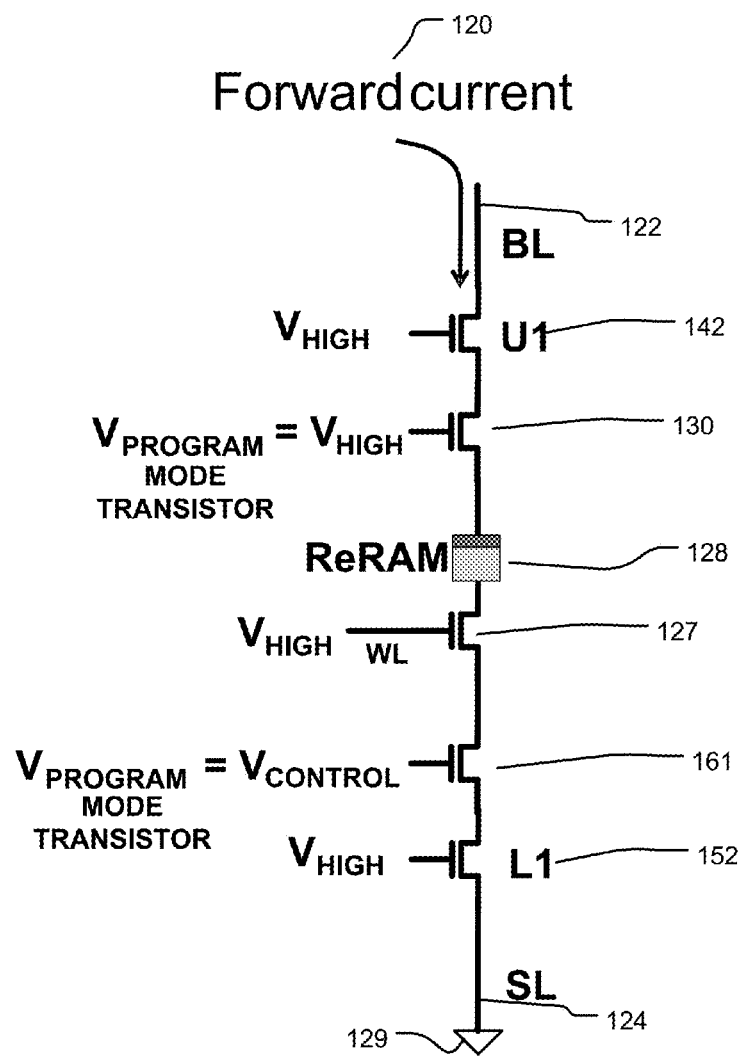
FIGS. 9-10 are schematics of another example in this invention, illustrating forward current and reverse current biasing arrangements of a memory element, with transistors electrically coupled to opposite sides of the memory element that respectively receive voltages of $V_{HIGH}$ and $V_{CONTROL}$.
Figure 10:
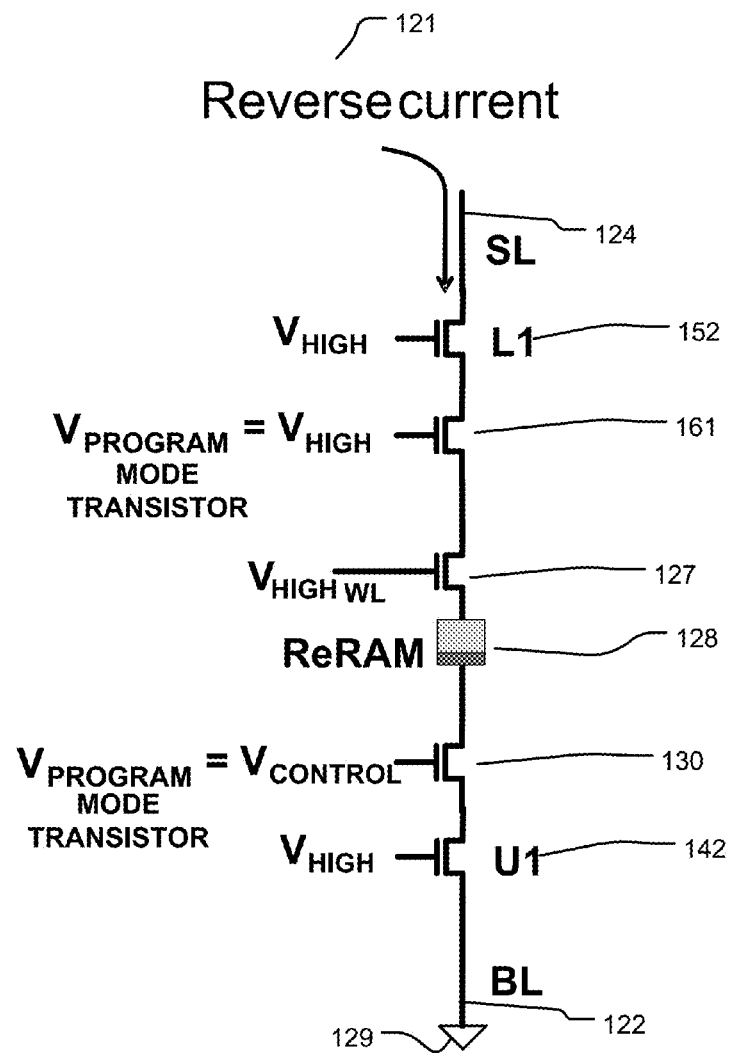

FIGS. 9 and 10 are schematics of another example illustrating forward current and reverse current biasing arrangements of a memory cell that does not use the cell selection device coupled to the word line as a controlled transistor.

The example of the memory cell undergoing forward current biasing as shown in FIG. 9 has many of the same parts as shown in FIG. 4. However, second controlled transistor 161 is added to the drawing in series in between cell selection transistor 127 and lower decoder transistor L1 152.

In the forward current mode shown in FIG. 9, an on voltage $V_{HIGH}$ is applied to the word line of cell selection transistor 127 and a voltage $V_{CONTROL}$ is applied to the gate of second controlled transistor 161, which results in an appropriate $V_{GS}$ of second controlled transistor 161 to limit the magnitude of forward current flow through the series circuit.

In the reverse current mode shown in FIG. 10, an on voltage $V_{HIGH}$ is applied to second controlled transistor 161, on voltage $V_{HIGH}$ is applied to the word line of the cell selection transistor 127, and a voltage $V_{CONTROL}$ is applied to the gate of second controlled transistor 130, which results in an appropriate $V_{GS}$ of cell selection transistor 127 to limit the magnitude of forward current flow through the series circuit.

Figure 11:
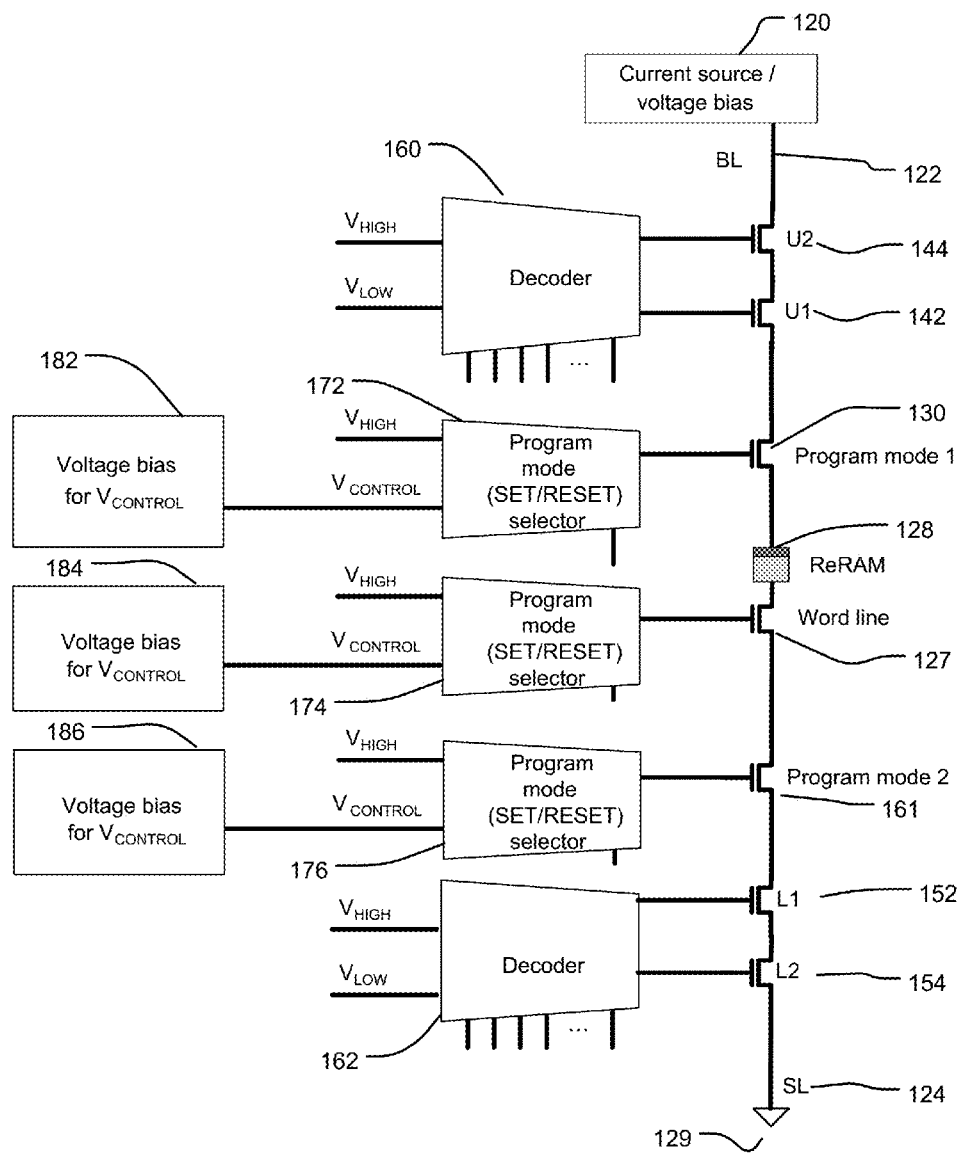
FIG. 11 is a schematic of a forward current and reverse current biasing arrangement of a memory element, with a block diagram of control circuitry that controls decoding with decoding transistors, and controls the program mode with controlled transistors that are electrically coupled to opposite sides of the memory element which respectively receive voltages of $V_{HIGH}$ and $V_{CONTROL}$.

FIG. 11 is a schematic of a forward current and reverse current biasing arrangement of a memory cell, with a block diagram of control circuitry that controls decoding with decoding transistors, and controls the program mode with controlled transistors that are electrically coupled to opposite sides of the memory cell which respectively receive voltages of $V_{HIGH}$ and $V_{CONTROL}$.

The example of the memory schematic as shown in FIG. 11 has many of the same parts as shown in FIG. 8. However, second controlled transistor 161 is added in series in between cell selection transistor 127 and lower decoder transistor L1 152.

Program mode (SET/RESET) selector 176 receives a program mode input signal that selects the program mode SET or RESET, and then electrically selectively couples voltages of $V_{HIGH}$ and $V_{CONTROL}$ as gate voltage to second controlled transistor 161. In conjunction program mode (SET/RESET) selectors 172, 174, and 176 couple the voltages of $V_{HIGH}$ to first controlled transistor 130; $V_{HIGH}$ as a gate voltage to one of second controlled transistor 161 and cell selection transistor 127, and $V_{CONTROL}$ to the other of second controlled transistor 161 and cell selection transistor 127. Alternatively, program mode (SET/RESET) selectors 172, 174, and 176 couple the voltages of $V_{CONTROL}$ to first controlled transistor 130, and $V_{HIGH}$ to second controlled transistor 161 and cell selection transistor 127 as gate voltages.

The voltage of $V_{HIGH}$ is sufficient to fully turn on the controlled transistors 130 and 161, controlled transistor 130 and cell selection transistor 127, such that the respective transistors are in saturation mode. The voltage of $V_{CONTROL}$ results in an appropriate $V_{GS}$ that biases first controlled transistor 130, second controlled transistor 161, or cell selection transistor 127, in linear or triode mode, to limit the magnitude of forward current flow through the series circuit.

Program mode (SET/RESET) selector 176 receives a program mode input signal that selects the program mode SET or RESET, and then electrically selectively couples the voltages of $V_{HIGH}$ and $V_{CONTROL}$ as gate voltage to second controlled transistor 161.

The voltage of $V_{CONTROL}$ is generated by the voltage bias circuit 186 in a manner similar to voltage bias circuits 182 and 184.

In various embodiments, the number and position of decoder transistors are different and depend on the decoding requirements as determined by addressing requirements and array configurations. In various embodiments, linear or triode mode bias can be changed to another bias which allows variable current control. In various embodiments, cutoff mode bias can be changed to another bias which allows negligible current flow. In various embodiments, the controlled transistors and the ReRAM device, instead of being electrically adjacent, are separated by one or more devices such as one or more decoder transistors.

Figure 12:
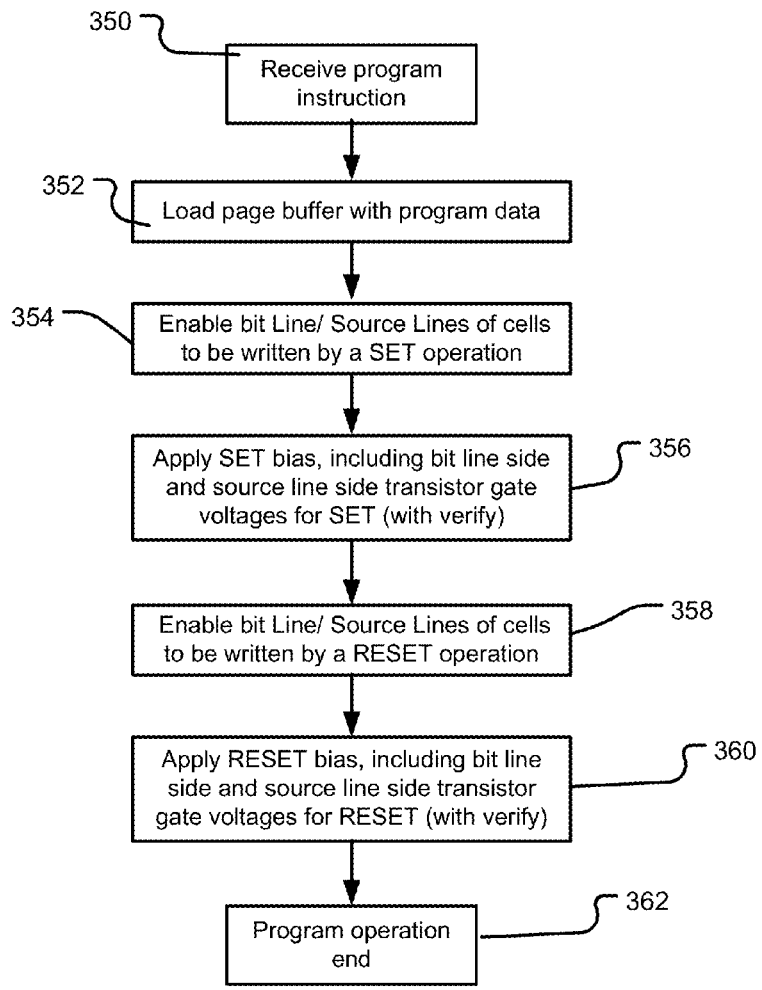
FIG. 12 is an example flowchart of the program operation.

FIG. 12 is a simplified flowchart of the program operation according to a method of operating memory for bipolar programming of programmable resistance memory cells. The method begins with a program command 350. Then the page buffer or other buffer on the device is loaded with program data 352. The controller then enables bit lines and source lines of cells to be written using a SET operation, according to the program data (354). After a settling time if necessary, a SET bias is applied. The SET bias includes a set pulse of current through cells, and the bit line side and source line side transistor gate voltages for the switch transistors on the enabled bit lines and source lines. Also, a SET verify and retry process may be executed (356). In this first program mode the control circuitry causes current flow through the programmable memory cell in a first direction from the bit line side to the source line side, and causes the bit line side driver circuits to apply a non-current limiting gate voltage to the particular transistors on the bit line side, and the control circuitry applies a current limiting gate voltage to the particular transistors on the source line side. Then, according to this example, the controller enables bit lines and source lines of cells to be written using a RESET operation, according to the program data (358). After a settling time if necessary, a RESET bias is applied. The RESET bias includes a set pulse of current through cells, and the bit line side and source line side transistor gate voltages for the switch transistors on the enabled bit lines and source lines. Also, a RESET verify and retry process may be executed (360). In this second program mode the control circuitry causes current flow through the programmable memory cell in a second direction from the source line side to the bit line side, and causes the bit line side driver circuits to apply a current limiting gate voltage to the particular transistors on the bit line side, and the control circuitry applies a non-current limiting gate voltage to the particular transistors on the source line side. After the SET and RESET operations, the program operation ends for the data in the buffer (362).

Figure 13:
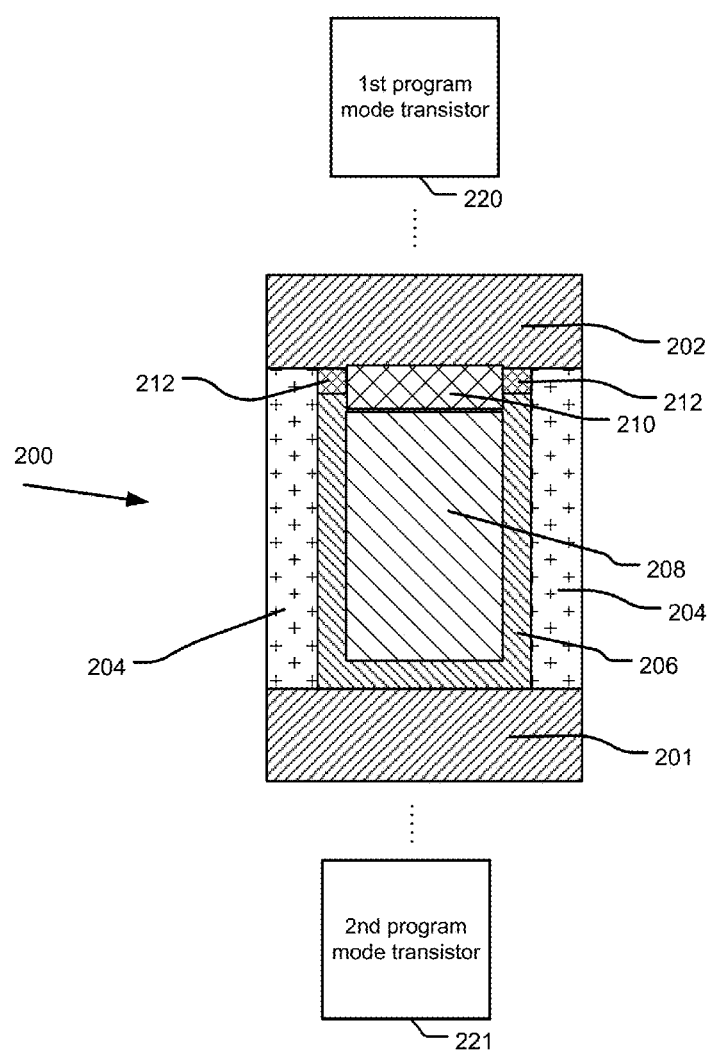
FIG. 13 is a simplified cross-sectional view of an example of a variable resistance memory element.

FIG. 13 is a simplified cross-sectional view of an example of a programmable resistance memory element 200, also called ReRAM. The programmable resistance memory element 200 is electrically coupled in series in between the 1st controlled transistor 220 and 2nd controlled transistor 221. The 1st controlled transistor 220 and 2nd controlled transistor 221 are biased in conjunction as discussed in connection with other figures.

In the memory cell 200, a conductive plug 208 extends through an insulating dielectric layer 204, for example a silicon dioxide layer. The conductive plug 208 may comprise an adhesion layer 206. In the embodiment shown, the conductive plugs are tungsten plugs and the adhesion layers are TiN liners including sidewall portions and bottom portions. A memory material 210 is on the conductive plug 208. The memory material 210 can be an oxide of the conductive plug 208. On top of the adhesion layer 206 is a region of oxidized adhesion layer 212. A conductive layer 202 (top electrode) is formed over at least the memory material 210. Another conductive layer 201 (bottom electrode) is formed below at least the memory material 210 adhesion layer 206. In various embodiments, the material of the conductive plugs could be other metals such as Ti, Ta, Al, TiN, TaN, Cu, Zr, Gd, Yb, and Hf. The adhesion layer can be a conductive metal nitride including titanium nitride, tungsten nitride, tantalum nitride, titanium, and others. Adhesion layers can also be a metal such as titanium.

The memory material can comprise materials such as a metal oxide, including tungsten oxide (WO), hafnium oxide (HfO), titanium oxide (TiO), tantalum oxide (TaO), titanium nitride oxide (TiNO), nickel oxide (NiO), ytterbium oxide (YbO), aluminum oxide (AlO), niobium oxide (NbO), zinc oxide (ZnO), copper oxide (CuO), anadium oxide (VO), molybdenum oxide (MoO), ruthenium oxide (RuO), copper silicon oxide (CuSiO), silver zirconium oxide (AgZrO), aluminum nickel oxide (AlNiO), aluminum titanium oxide (AlTiO), gadolinium oxide (GdO), gallium oxide (GaO), zirconium oxide (ZrO), chromium doped SrZrO, chromium doped SrTiO, PCMO, or LaCaMnO, etc. (atomic percent subscripts omitted).

Figure 14:
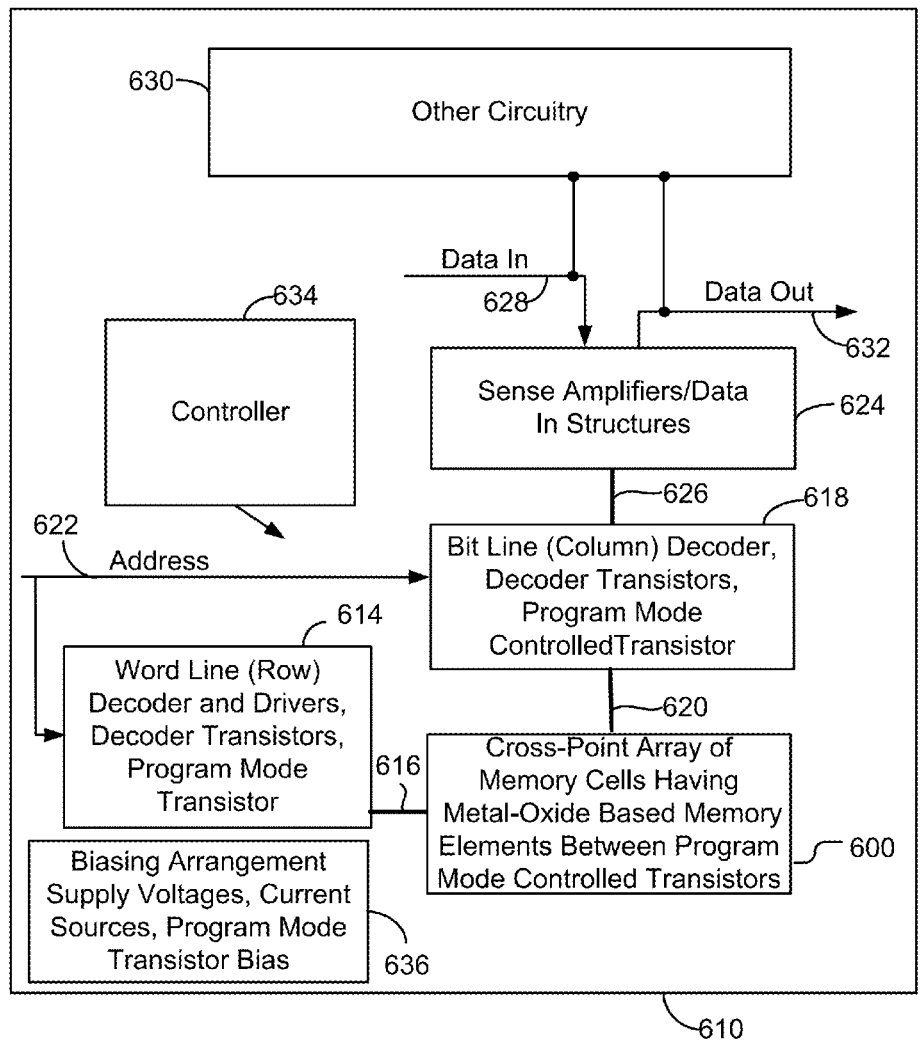
FIG. 14 is a simplified block diagram of an integrated circuit array in accordance with an embodiment.

FIG. 14 is a simplified block diagram of an integrated circuit 610 including a cross-point memory array 600 of programmable memory cells having metal-oxide based memory elements between program mode controlled transistors. Block 614 includes a word line decoder coupled to and in electrical communication with a plurality of word lines 616. Block 614 also includes word line decoder transistors and a controlled transistor. Block 618 includes a bit line (column) decoder in electrical communication with a plurality of bit lines 620 to read data from, and write data to, the memory cells in the array 600. Block 618 also includes bit line decoder transistors and a controlled transistor. Addresses are supplied on bus 622 to the word line decoder in block 614 and the bit line decoder in block 618. Sense amplifiers and data-in structures in block 624 are coupled to the bit line decoder in block 618 via data bus 626. Data is supplied via a data-in line 628 from input/output ports on integrated circuit 610, or from other data sources internal or external to integrated circuit 610, to data-in structures in block 624. Other circuitry 630 may be included on integrated circuit 610, such as a general purpose processor or special purpose application circuitry, or a combination of modules providing system-on-a-chip functionality supported by memory array 600. Data is supplied via a data-out line 632 from the sense amplifiers in block 624 to input/output ports on integrated circuit 610, or to other data destinations internal or external to integrated circuit 610.

A controller 634 implemented in this example, using a bias arrangement state machine, controls block 636 which includes bias arrangement supply voltages, such as read voltages, voltages such as set and reset, and program verify voltages such as for set and reset. Block 636 also includes current sources for operations and bias circuitry for the controlled transistors. The controller 634 applies forward current and reverse current biasing arrangements of a memory cell, with transistors electrically coupled to opposite sides of the memory cell that respectively receive $V_{HIGH}$ and $V_{CONTROL}$ gate voltages.

The controller 634 programs memory cells in the array 600 in a plurality of program modes including at least a first program mode and a second program mode, such as described above with reference to FIG. 12.

In the first program mode, the controller 634 causes current flow through the programmable memory cell in a first direction from the first electrode to the second electrode, applies the first non-current limiting gate voltage to the first transistor, and applies the second current limiting gate voltage to the second transistor.

In the second program mode, the controller causes current flow through the programmable memory cell in a second direction from the second electrode to the first electrode, applies the second non-current limiting gate voltage to the second transistor, and applies the first current limiting gate voltage to the first transistor.

The first current limiting gate voltage is less than the first non-current limiting gate voltage. The second current limiting gate voltage is less than the second non-current limiting gate voltage.

The controller 634 selectively programs a programmable resistance of the programmable memory cell to: (i) within a first target resistance range in the first program mode, and (ii) within a second target resistance range in the second program mode, wherein the first target resistance range and the second target resistance range are non-overlapping.

In both the forward and reverse current directions, the controller 634 controls bias arrangements such that at least one of the controlled transistors receives a gate voltage of $V_{CONTROL}$ less than the non-current limiting gate voltage, such that the transistor is biased in linear or triode mode. The particular controlled transistor that is biased in linear or triode mode has a source terminal that is not coupled to a ReRAM cell a variable voltage, which improves control of $V_{GS}$ of the controlled transistor and the resulting current flow.

Controller 634 may be implemented using special-purpose logic circuitry as known in the art. In alternative embodiments, controller 634 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 634.

A method of manufacturing an integrated circuit as described herein includes forming an array of programmable memory cells and decoder circuits which selectively connect memory cells in the array to source side and bit line side voltage sources, the decoder circuits including one or more transistors on a bit line side and one or more transistors on a source line side of each programmable memory cell in the array; forming bit line side driver circuits which apply gate voltages to particular bit line side transistors the one or more transistors on the bit line side of memory cells, and source line side driver circuits which apply gate voltages to particular source line side transistors of the one or more transistors on the source line side of memory cells; and forming control circuitry coupled to the decoder circuits, the bit line side driver circuits and to the source line side driver circuits. The control circuits have
- a first program mode in which the control circuitry causes current flow through the programmable memory cell in a first direction from the bit line side to the source line side, and causes the bit line side driver circuits to apply a non-current limiting gate voltage to a particular transistor of the one or more transistors on the bit line side, and the control circuitry applies a current limiting gate voltage to a particular transistor of the one or more transistors on the source line side; and
- a second program mode in which the control circuitry causes current flow through the programmable memory cell in a second direction from the source line side the bit line side, and causes the bit line side driver circuits to apply a current limiting gate voltage to the particular transistor of the one or more transistors on the bit line side, and the control circuitry applies a non-current limiting gate voltage to the particular transistor of the one or more transistors on the source line side.

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit, comprising:
   an array of programmable memory cells and decoder circuits which selectively connect memory cells in the array to source side and bit line side voltage sources, the decoder circuits including one or more transistors on a bit line side and one or more transistors on a source line side of each programmable memory cell in the array;
   bit line side driver circuits which apply gate voltages to the one or more transistors on the bit line side of memory cells, and source line side driver circuits which apply gate voltages to the one or more transistors on the source line side of memory cells; and
   control circuitry coupled to the decoder circuits, the bit line side driver circuits and to the source line side driver circuits, which have:
      a first program mode in which the control circuitry causes current flow through the programmable memory cell in a first direction from the bit line side to the source line side, and causes the bit line side driver circuits to apply a non-current limiting gate voltage to a particular transistor of the one or more transistors on the bit line side, and the control circuitry applies a current limiting gate voltage to a particular transistor of the one or more transistors on the source line side; and
      a second program mode in which the control circuitry causes current flow through the programmable memory cell in a second direction from the source line side the bit line side, and causes the bit line side driver circuits to apply a current limiting gate voltage to the particular transistor of the one or more transistors on the bit line side, and the control circuitry applies a non-current limiting gate voltage to the particular transistor of the one or more transistors on the source line side.

2. The integrated circuit of claim 1, wherein each memory cell includes:
   a first electrode on the bit line side;
   a second electrode on the source line side;
   a programmable element comprising metal oxide, the programmable element electrically coupled in between at least the first electrode and the second electrode; and
   a cell selection device on the source line side of the second electrode, and coupled to a word line.

3. The integrated circuit of claim 2, wherein the cell selection device is the particular transistor on the source line side in the decoder circuits, and the source line side driver is coupled to the word lines.

4. The integrated circuit of claim 1, wherein the array includes local bit lines and global bit lines, and decoder circuits include local bit line select transistors which connect local bit lines to global bit lines, and the local bit line select transistors include the particular transistor on the bit line side in the decoder circuits, and the bit line side driver circuits are coupled to the local bit line select lines that are coupled to the local bit line select transistors.

5. The integrated circuit of claim 1, wherein the current limiting gate voltage applied on the bit line side has a lower magnitude than the non-current limiting gate voltage applied on the bit line side, and the current limiting gate voltage applied on the source line side has a lower magnitude than the non-current limiting gate voltage applied on the source line side.

6. The integrated circuit of claim 1, wherein the control circuitry causes the first program mode to perform set on the programmable memory cell and the second program mode to perform reset on the programmable memory cell.

7. The integrated circuit of claim 1, wherein the programmable memory cell has a programmable resistance.

8. The integrated circuit of claim 1, wherein the control circuitry selectively programs a programmable resistance of the programmable memory cell to: (i) within a first target resistance range in the first program mode, and (ii) within a second target resistance range in the second program mode, wherein the first target resistance range and the second target resistance range are non-overlapping.

9. A memory, comprising:
   an array of programmable resistance memory cells, the array including bit lines, source lines and word lines, the memory cells in the array including respectively, memory elements in series with a bit line side switch or a source line side switch, between corresponding bit lines and source lines, with corresponding word lines connected to cell selection devices;
   a bit line side controlled current/voltage source;
   a source line side controlled current/voltage source;
   a bit line decoder including bit line side switches which connect the bit line side controlled current/voltage source to bit lines in the array in response to bit line transistor gate voltages;
   a source line decoder including source line side switches which connect the source side controlled current/voltage source to source lines in the array in response to source line transistor gate voltages;
   a first driver for a bit line side gate voltage, the first driver having a first mode for operations including a first current direction through the memory cell, and a second mode for operations including a second current direction through the memory cell; and
   a second driver for a source line side gate voltage, the second driver having a first mode for operations including said first current direction through the memory cell, and a second mode for operations including said second current direction through the memory cell, wherein:
   in the first mode, a current path through a selected memory cells is between the bit line side controlled current/voltage source on the bit line side of the memory cell and a reference potential on the source line side of the memory cell, and the source line side gate voltage applied to one of the source line side switches has a value setting the source line side switch to operate in a moderated resistance mode; and
   in the second mode, a current path through a selected memory cells is between the source line side controlled current/voltage source on the source line side of the memory cell and a reference potential on the bit line side of the memory cell, and the bit line side gate voltage applied to one of the bit line side switches has a value setting the bit line side switch to operate in a moderated resistance mode.

10. A method for operating an integrated circuit memory, the memory comprising an array of programmable memory cells and decoder circuits which selectively connect memory cells in the array to source side and bit line side voltage sources, the decoder circuits including one or more transistors on a bit line side and one or more transistors on a source line side of each programmable memory cell in the array, bit line side driver circuits which apply gate voltages to the one or more transistors on the bit line side of memory cells, and source line side driver circuits which apply gate voltages to the one or more transistors on the source line side of memory cells, the method comprising:
   executing a first program mode in which current flows through the programmable memory cell in a first direction from the bit line side to the source line side, and during the first program mode applying a non-current limiting gate voltage to a particular transistor of the one or more transistors on the bit line side, and the control circuitry applies a current limiting gate voltage to a particular transistor of the one or more transistors on the source line side; and
   executing a second program mode in which current flows through the programmable memory cell in a second direction from the source line side to the bit line side, and during the second program mode applying a current limiting gate voltage to the particular transistor of the one or more transistors on the bit line side, and applying a non-current limiting gate voltage to the particular transistor of the one or more transistors on the source line side.

11. The method of claim 10, wherein each memory cell includes:
   a first electrode on the bit line side;
   a second electrode on the source line side;
   a programmable element comprising metal oxide, the programmable element electrically coupled in between at least the first electrode and the second electrode; and
   a cell selection device on the source line side of the second electrode, and coupled to a word line.

12. The method of claim 11, wherein the cell selection device is the particular transistor on the source line side in the decoder circuits.

13. The method of claim 10, wherein the array includes local bit lines and global bit lines, and decoder circuits include local bit line select transistors which connect local bit lines to global bit lines, and the local bit line select transistors include the particular transistor on the bit line side in the decoder circuits.

14. The method of claim 10, wherein the current limiting gate voltage applied on the bit line side has a lower magnitude than the non-current limiting gate voltage applied on the bit line side, and the current limiting gate voltage applied on the source line side has a lower magnitude than the non-current limiting gate voltage applied on the source line side.

15. The method of claim 10, wherein the first program mode performs set on the programmable memory cell and the second program mode performs reset on the programmable memory cell.

16. The method of claim 10, wherein the programmable memory cell has a programmable resistance.

17. The method of claim 10, including programming a programmable resistance of the programmable memory cell to: (i) within a first target resistance range in the first program mode, and (ii) within a second target resistance range in the second program mode, wherein the first target resistance range and the second target resistance range are non-overlapping.

18. A method of bipolar programming of a programmable memory cell with a first transistor receiving a first non-current limiting gate voltage and a first control gate voltage and a second transistor receiving a second non-current limiting gate voltage and a second control gate voltage, comprising:
   programming the programmable memory cell in a first program mode by:
      causing current flow through the programmable memory cell in a first direction;

applying the first non-current limiting gate voltage to the first transistor electrically coupled to a first electrode of the programmable memory cell; and applying the second control gate voltage to the second transistor electrically coupled to a second electrode of the programmable memory cell; and programming the programmable memory cell in a second program mode by:

causing current flow through the programmable memory cell in a second direction opposite to the first direction;

applying the second non-current limiting gate voltage to the second transistor electrically coupled to the second electrode of the programmable memory cell; and applying the first control gate voltage to the first transistor electrically coupled to the first electrode of the programmable memory cell, wherein the first control gate voltage is less than the first non-current limiting gate voltage, and the second control gate voltage is less than the second non-current limiting gate voltage.

19. A method of manufacturing an integrated circuit, comprising:

forming an array of programmable memory cells and decoder circuits which selectively connect memory cells in the array to source side and bit line side voltage sources, the decoder circuits including one or more transistors on a bit line side and one or more transistors on a source line side of each programmable memory cell in the array;

forming bit line side driver circuits which apply gate voltages to the one or more transistors on the bit line side of memory cells, and source line side driver circuits which apply gate voltages to the one or more transistors on the source line side of memory cells; and forming control circuitry coupled to the decoder circuits, the bit line side driver circuits and to the source line side driver circuits, which have:

a first program mode in which the control circuitry causes current flow through the programmable memory cell in a first direction from the bit line side to the source line side, and causes the bit line side driver circuits to apply a non-current limiting gate voltage to a particular transistor of the one or more transistors on the bit line side, and the control circuitry applies a current limiting gate voltage to a particular transistor of the one or more transistors on the source line side; and a second program mode in which the control circuitry causes current flow through the programmable memory cell in a second direction from the source line side to the bit line side, and causes the bit line side driver circuits to apply a current limiting gate voltage to the particular transistor of the one or more transistors on the bit line side, and the control circuitry applies a non-current limiting gate voltage to the particular transistor of the one or more transistors on the source line side.

\* \* \* \* \*